United States Patent
Shin et al.

(10) Patent No.: US 9,552,318 B2
(45) Date of Patent: Jan. 24, 2017

(54) REMOVABLE MEMORY CARD TYPE DETECTION SYSTEMS AND METHODS

(71) Applicant: QUALCOMM Incorporated, San Diego, CA (US)

(72) Inventors: Hyunsuk Shin, San Diego, CA (US); Henry Laurel Sanchez, Carlsbad, CA (US); Hung Quoc Vuong, San Diego, CA (US); Amit Gil, Zichron Yaakov (IL)

(73) Assignee: QUALCOMM Incorporated, San Diego, CA (US)

( * ) Notice: Subject to any disclaimer, the term of this patent is extended or adjusted under 35 U.S.C. 154(b) by 160 days.

(21) Appl. No.: 14/295,653

(22) Filed: Jun. 4, 2014

(65) Prior Publication Data
US 2015/0356040 A1 Dec. 10, 2015

(51) Int. Cl.
*G06F 12/02* (2006.01)
*G06F 13/40* (2006.01)
(Continued)

(52) U.S. Cl.
CPC ....... *G06F 13/4022* (2013.01); *G06F 13/4068* (2013.01); *G06F 13/4234* (2013.01);
(Continued)

(58) Field of Classification Search
CPC .............. G06F 13/4022; G06F 13/4234; G06F 13/4068; G11C 16/14; G11C 16/34; G11C 16/20; G06K 19/077; G06K 13/067
See application file for complete search history.

(56) References Cited

U.S. PATENT DOCUMENTS 6,454,164 B1 9/2002 Wakabayashi et al.
7,367,844 B2 5/2008 Xu
(Continued)

FOREIGN PATENT DOCUMENTS

EP 2037372 A2 3/2009
EP 2085887 A1 8/2009

OTHER PUBLICATIONS

International Search Report and Written Opinion for PCT/US2015/033649, mailed Oct. 6, 2015, 12 pages.
(Continued)

*Primary Examiner* — Hiep Nguyen
(74) *Attorney, Agent, or Firm* — Withrow & Terranova, PLLC

(57) ABSTRACT

Removable memory card type detection systems and methods are disclosed. In one aspect, a removable memory card is inserted into a receptacle of a host. The host determines a type of removable memory card based upon either electrical or physical properties of the removable memory card. In this manner, if the host detects that the removable memory card possesses certain electrical or physical properties associated with a microSD card, the host determines that the removable memory card is a microSD type card. If the host detects that the removable memory card possesses certain electrical or physical properties associated with a UFS card, the host determines that the removable memory card is a UFS type card. By determining the card type based on detection of certain electrical or physical properties, aspects disclosed herein are able to distinguish between UFS and microSD cards without requiring an additional pin or card initialization time.

28 Claims, 9 Drawing Sheets

(51) Int. Cl.
*G06F 13/42* (2006.01)
*G11C 16/14* (2006.01)
*G11C 16/34* (2006.01)
*G11C 16/20* (2006.01)

(52) U.S. Cl.
CPC .............. *G11C 16/14* (2013.01); *G11C 16/20* (2013.01); *G11C 16/34* (2013.01)

(56) References Cited

U.S. PATENT DOCUMENTS

| | | | |
|---|---|---|---|
| 7,376,773 B2 | 5/2008 | Kim et al. | |
| 8,296,491 B2 | 10/2012 | Pinto et al. | |
| 8,301,822 B2 | 10/2012 | Pinto et al. | |
| 2002/0179706 A1 | 12/2002 | Nishigata et al. | |
| 2003/0154326 A1 | 8/2003 | Tseng et al. | |
| 2004/0006654 A1* | 1/2004 | Bando | G06F 13/4072 710/1 |
| 2005/0036397 A1* | 2/2005 | Yeh | G06F 3/061 365/232 |
| 2005/0038956 A1 | 2/2005 | Yeh et al. | |
| 2010/0125689 A1* | 5/2010 | Chang | G06F 13/387 710/301 |
| 2010/0131707 A1* | 5/2010 | Chi | G06F 13/385 711/115 |
| 2010/0205341 A1* | 8/2010 | Chen | G06F 13/385 710/301 |
| 2011/0016248 A1* | 1/2011 | Takahashi | G06F 13/4081 710/301 |
| 2012/0315781 A1 | 12/2012 | Little et al. | |
| 2015/0143022 A1* | 5/2015 | Shacham | G06F 12/0246 711/103 |

OTHER PUBLICATIONS

Second Written Opinion for PCT/US2015/033649, mailed May 20, 2016, 8 pages.
International Preliminary Report on Patentability for PCT/US2015/033649, mailed Oct. 25, 2016, 29 pages.

* cited by examiner

REMOVABLE MEMORY CARD TYPE DETECTION SYSTEMS AND METHODS

BACKGROUND

I. Field of the Disclosure

The technology of the disclosure relates generally to removable memory cards.

II. Background

Mobile terminals have become ubiquitous in modern society. While mobile phones, and in particular, smart phones, have garnered a majority of the attention, numerous other mobile terminals such as cameras, audio players, video recorders, and the like are also widely available. Many of these devices rely on removable memory media to store data. For example, a camera may store photos on a removable memory card. Less portable computing devices, such as desktop computers, may also have receptacles that receive the removable memory card. In this regard, a person may take a picture with the camera, store the picture on the removable memory card, remove the card from the camera, insert the card into the receptacle on a desktop computer, and transfer the picture to a hard drive of the desktop computer.

Many removable memory cards are some form of Flash memory. However, even with the common Flash memory format, there are numerous proprietary removable memory cards, including those provided by Compact Flash (I and II), Secure Digital (SD) (SD, miniSD, microSD, SDHC, miniSDHC, microSDHC, SDXC), Memory Stick (Standard, Pro, Pro Duo, Pro-HG Duo, Micro (M2), xC), MultiMediaCard (MMC) (MMC, RS-MMC, MMCmobile, MMCplus, MMCmicro), Serial Peripheral Interface (SPI) mode of operation within a card format, xD (Standard, Type M, Type H, Type M+), XQD, or Ultra High Speed (UHS) (I and II).

In addition to the removable versions of Flash memory, a number of Flash memory protocols exist that are designed for embedded or otherwise non-removable memory units. Such embedded Flash memory units may be soldered or otherwise permanently affixed to printed circuit boards or substrates of an electronic device. One such protocol is the Universal Flash Storage (UFS) standard proposed by the Joint Electron Device Engineering Council (JEDEC).

To date, UFS has not been applied to a removable memory card protocol. Computing devices, or hosts, will need to be able to deal with UFS-compliant removable memory cards when such cards are available. To avoid addition of a dedicated UFS receptacle, hosts may need to support UFS-compliant cards via the same receptacle used to support SD-compliant cards. Such support will require hosts to be able to distinguish between UFS- and SD-compliant removable memory cards. One way for a host to distinguish between card types is by employing an additional pin in a receptacle that receives card type information from a switch that differentiates between UFS- and SD-compliant card form factors. However, employing an additional pin increases size and cost of the receptacle. Instead of employing an additional pin, a host may distinguish between UFS- and SD-compliant cards using protocol initialization signaling. For example, a host may employ a signaling sequence of first attempting to initialize a removable memory card using a SD protocol, and attempting to initialize the card using a UFS protocol only if the SD protocol initialization is unsuccessful. However, using a series of protocol initializations in this manner increases the amount of time required to initialize the removable memory card. Thus, it would be advantageous for hosts to be able to distinguish between UFS- and SD-compliant removable memory cards without requiring an additional pin or incurring increased card initialization time.

SUMMARY OF THE DISCLOSURE

Aspects disclosed in the detailed description include removable memory card type detection systems and methods. In particular, exemplary aspects distinguish between micro Secure Digital (microSD) and Universal Flash Standard (UFS) removable memory cards (also referred to as "microSD cards" and "UFS cards," respectively). That is, a host, as that term is defined by the Flash standards, may have a receptacle that supports both the microSD card form factor and the future, yet to be defined UFS card form factor. The receptacle may be configured to receive a device, as that term is defined by the Flash standards. In use, a removable memory card is inserted into the receptacle. Upon insertion of the removable memory card into the receptacle, the host determines a type of the removable memory card based upon either electrical or physical properties of the removable memory card. In this manner, if the host detects that the removable memory card possesses certain electrical or physical properties associated with a microSD card, the host determines that the removable memory card is a microSD type card. If the host detects that the removable memory card possesses certain electrical or physical properties associated with a UFS card, the host determines that the removable memory card is a UFS type card. By determining the card type based on detection of certain electrical or physical properties, exemplary aspects disclosed herein are able to distinguish between UFS and microSD cards without requiring an additional pin or incurring increased card initialization time.

In this manner, in one aspect, a removable memory card type detection system detects whether a particular contact on a removable memory card is coupled to a pre-defined voltage. If the system detects that the contact is not coupled to the pre-defined voltage, the system determines that the removable memory card is a microSD card, and communicates with the card using a microSD protocol. If the system detects that the contact is coupled to the pre-defined voltage, the system determines that the removable memory card is a UFS card, and communicates with the card using a UFS protocol. In another aspect, a removable memory card type detection system employs switches and a control circuit to detect whether a removable memory card possesses a microSD or UFS form factor. More specifically, upon insertion of the removable memory card, an insertion switch provides a signal that notifies the control circuit of card insertion. Further, a type switch provides a signal that notifies the control circuit of the card type based upon the form factor of the card. Software executed on the control circuit uses the signals from the insertion switch and the type switch to provide a detection signal that notifies a control system of both card insertion and card type via a single pin. If the detection signal indicates that the removable memory card is a microSD card, the control system communicates with the card using a microSD protocol. If the detection signal indicates that the removable memory card is a UFS card, the control system communicates with the card using a UFS protocol.

In this regard in one aspect, a removable memory card receptacle for receiving removable memory cards is disclosed. The removable memory card receptacle comprises a housing. The housing comprises a pin configured to operatively couple with a corresponding contact on an inserted removable memory card. The removable memory card receptacle further comprises a control system operatively coupled to the pin of the housing. The control system is configured to detect whether the corresponding contact is coupled to a pre-defined voltage.

In another aspect, a method for detecting a type of a removable memory card inserted into a receptacle for receiving removable memory cards is disclosed. The method comprises detecting whether a corresponding contact on an inserted removable memory card is coupled to a pre-defined voltage.

In another aspect, a removable memory card receptacle for receiving removable memory cards is disclosed. The removable memory card receptacle comprises a housing. The housing comprises a pin coupled to a control circuit. The removable memory card receptacle further comprises a type switch coupled to the control circuit. The type switch is configured to discriminate between types of removable memory cards based on differing form factors. The control circuit comprises software configured to receive a type signal from the type switch to detect the type of the removable memory card inserted into a removable memory card receptacle.

In another aspect, a method for detecting a type of a removable memory card placed into a receptacle for receiving removable memory cards is disclosed. The method comprises discriminating between types of removable memory cards based on differing form factors using a type switch. The method further comprises receiving, by a control circuit, a type signal from the type switch to detect the type of the removable memory card inserted into a removable memory card receptacle.

DETAILED DESCRIPTION

Figure 1:
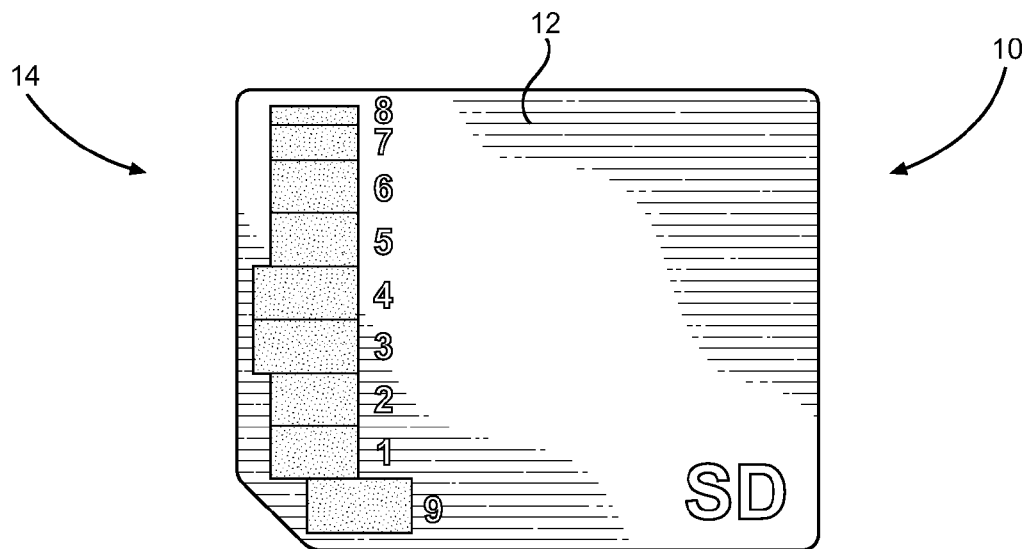
FIG. 1 is a top plan view of a conventional removable memory card conforming to a Secure Digital (SD) form factor.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include removable memory card type detection systems and methods. In particular, exemplary aspects distinguish between micro Secure Digital (microSD) and Universal Flash Standard (UFS) removable memory cards (also referred to as "microSD cards" and "UFS cards," respectively). That is, a host, as that term is defined by the Flash standards, may have a receptacle that supports both the microSD card form factor and the future UFS card form factor. The receptacle may be configured to receive a device, as that term is defined by the Flash standards. In use, a removable memory card is inserted into the receptacle. Upon insertion of the removable memory card into the receptacle, the host determines a type of the removable memory card based upon either electrical or physical properties of the removable memory card. In this manner, if the host detects that the removable memory card possesses certain electrical or physical properties associated with a microSD card, the host determines that the removable memory card is a microSD type card. If the host detects that the removable memory card possesses certain electrical or physical properties associated with a UFS card, the host determines that the removable memory card is a UFS type card. By determining the card type based on detection of certain electrical or physical properties, exemplary aspects disclosed herein are able to distinguish between UFS and microSD cards without requiring an additional pin or incurring increased card initialization time.

In this manner, in one aspect, a removable memory card type detection system detects whether a particular contact on a removable memory card is coupled to a pre-defined voltage. If the system detects that the contact is not coupled to the pre-defined voltage, the system determines that the removable memory card is a microSD card, and communicates with the card using a microSD protocol. If the system detects that the contact is coupled to the pre-defined voltage, the system determines that the removable memory card is a UFS card, and communicates with the card using a UFS protocol. In another aspect, a removable memory card type detection system employs switches and a control circuit to detect whether a removable memory card possesses a microSD or UFS form factor. More specifically, upon insertion of the removable memory card, an insertion switch provides a signal that notifies the control circuit of card insertion. Further, a type switch provides a signal that notifies the control circuit of the card type based upon the form factor of the card. Software executed on the control circuit uses the signals from the insertion switch and the type switch to provide a detection signal that notifies a control system of both card insertion and card type via a single pin. If the detection signal indicates that the removable memory card is a microSD card, the control system communicates with the card using a microSD protocol. If the detection signal indicates that the removable memory card is a UFS card, the control system communicates with the card using a UFS protocol.

As noted above, there are two types of Flash memory, removable and embedded. There are several flavors of removable Flash memory including SD, Memory Stick, Compact Flash, and the like. Likewise, there are several flavors of embedded Flash memory with embedded Multimedia Card (eMMC) being the primary flavor. While eMMC is the most common flavor of embedded Flash memory, the Joint Electron Device Engineering Council (JEDEC) is promoting UFS as the next primary standard. To date, JEDEC has focused on implementing UFS only as an embedded Flash product. U.S. Patent Application Ser. No. 61/867,343 filed Aug. 19, 2013, which is hereby incorporated by reference in its entirety, advanced the concept of UFS being used for removable memory cards. Because proposals to adopt UFS to a removable memory card are still emerging, the precise details of its implementation have not been standardized. One solution would be to produce a removable memory card with a form factor unique to UFS. Using a UFS-specific form factor has the advantage of making UFS removable memory cards physically distinguishable from cards of other flavors. However, there should be a way for devices that use removable memory cards to support the new UFS technology without being required to incorporate an additional, dedicated UFS receptacle.

Figure 2:
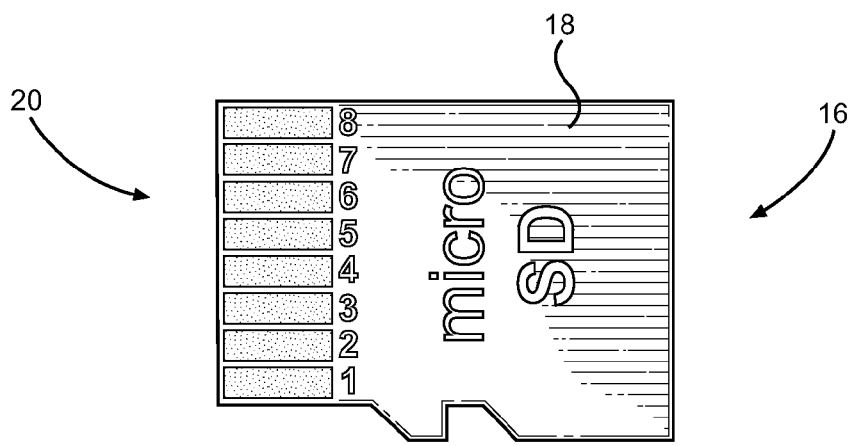
FIG. 2 is a top plan view of a conventional removable memory card conforming to a micro SD (microSD) form factor.
Figure 3:
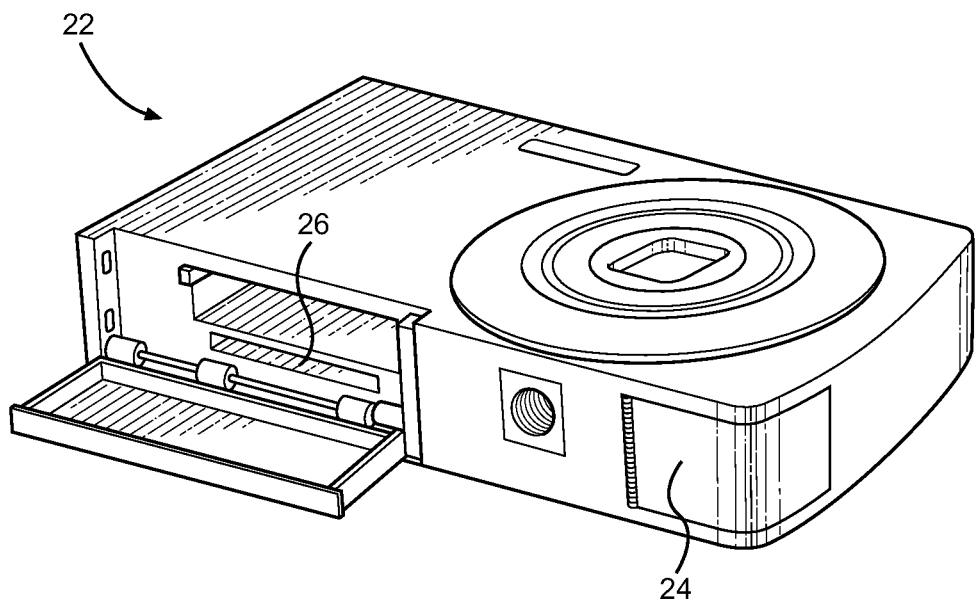
FIG. 3 is a perspective view of a mobile terminal adapted to discriminate between different removable memory card types according to exemplary aspects of the present disclosure.

Before addressing the particulars of distinguishing between types of removable memory cards using a single receptacle, a brief overview of hardware used in relation to removable memory cards is provided with reference to FIGS. 1-3. A process for detecting insertion of a removable memory card into a receptacle of a computing device is provided with reference to FIG. 4. A discussion of hardware and processes used to distinguish between a microSD removable memory card and a removable memory card compliant with UFS is provided with reference to FIGS. 5A-7C.

In this regard in FIG. 1, a top plan view of a conventional removable memory card 10 that complies with the SD form factor is illustrated. The removable memory card 10 includes a housing 12, which is typically a plastic housing within which memory elements of the removable memory card 10 are located. The memory elements within the housing 12 are accessed by contacts 14. The contacts 14, summarized in TABLE 1 below, allow data transfer to and from the memory elements within the removable memory card 10. Further, the contacts 14 may provide power, a clock signal, or similar signals as is well understood. In addition to the basic SD protocol, memory cards are available in other SD flavors, such as miniSD, microSD, SDHC, miniSDHC, microSDHC, and SDXC.

TABLE 1

SD CONTACT LAYOUT

SD CONTACT PURPOSE

| Contact | Name | Type | Description |
| --- | --- | --- | --- |
| 1 | CD/DAT3 | I/O/PP | Card detection/Connector data line 3 |
| 2 | CMD | PP | Command/Response line |
| 3 | Vss1 | S | Supply voltage (ground) |
| 4 | Vdd | S | Power supply |
| 5 | CLK | I | Clock |
| 6 | Vss2 | S | Supply voltage |
| 7 | DAT0 | I/O/PP | Connector data line 0 |
| 8 | DAT1 | I/O/PP | Connector data line 1 |
| 9 | DAT2 | I/O/PP | Connector data line 2 |

FIG. 2 illustrates a top plan view of a conventional removable memory card 16 that complies with the microSD form factor. Similar to the removable memory card 10 in FIG. 1 that complies with the SD form factor, the removable memory card 16 includes a housing 18 within which memory elements of the removable memory card 16 are located. Contacts 20 access the memory elements within the housing 18 and allow data transfer to and from the memory elements within the removable memory card 16. The contacts 20 are summarized in TABLE 2 below. Similar to the contacts 14 in FIG. 1, the contacts 20 may provide power, a clock signal, or similar signals as is well understood. Notably, while the present disclosure focuses on the microSD protocol, the concepts of the present disclosure are also applicable to other flavors of SD memory cards such as SD, miniSD, SDHC, miniSDHC, microSDHC, and SDXC.

TABLE 2 microSD CONTACT LAYOUT microSD CONTACT PURPOSE

| Contact | Name | Type | Description |
| --- | --- | --- | --- |
| 1 | DAT2 | I/O/PP | Connector data line 2 |
| 2 | CD/DAT3 | I/O/PP | Card detection/Connector data line 3 |
| 3 | CMD | PP | Command/Response line |
| 4 | Vdd | S | Power supply |
| 5 | CLK | I | Clock |
| 6 | Vss | S | Supply voltage |
| 7 | DAT0 | I/O/PP | Connector data line 0 |
| 8 | DAT1 | I/O/PP | Connector data line 1 |

It should be appreciated that the removable memory cards 10, 16 are well suited for use in computing devices and particularly with mobile terminals such as cameras, phones and the like. In this regard, FIG. 3 illustrates an exemplary mobile terminal 22, which in this case is a camera. The mobile terminal 22 may have an aperture 24 for a battery and a removable memory card receptacle 26 (also referred to herein as "receptacle"), which is configured to receive a removable memory card such as the removable memory cards 10, 16. The mobile terminal 22 has user interface elements such as a user input (e.g., the shutter button (not shown), a display screen (not shown), a touch screen (not shown), or the like). While mobile terminals are specifically contemplated as being suitable for use with aspects of removable memory card type detection systems and methods, other computing devices that use removable memory cards may also benefit from the present disclosure.

Figure 4:
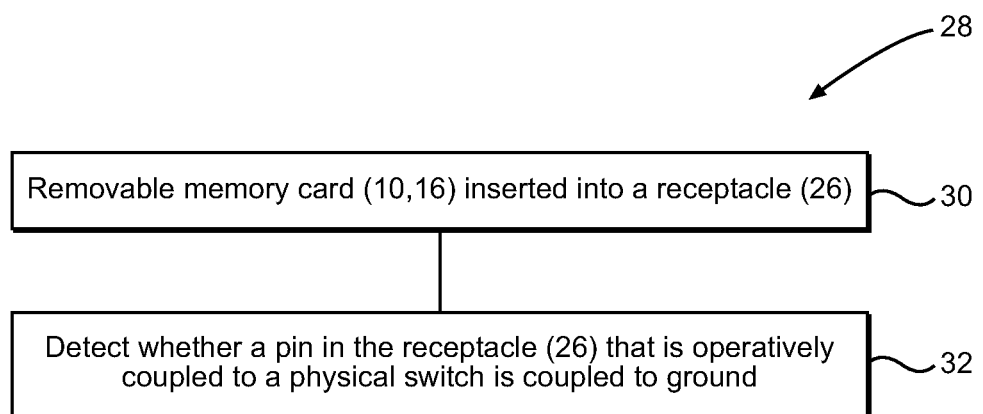
FIG. 4 is a flowchart illustrating a process for detecting insertion of a removable memory card into a removable memory card receptacle of a mobile terminal.

Before addressing removable memory card type detection systems and methods, FIG. 4 illustrates an exemplary process 28 for detecting insertion of the removable memory cards 10, 16 into the removable memory card receptacle 26 of the mobile terminal 22 in FIG. 3. In particular, if the receptacle 26 is configured to receive a SD card, the process 28 is applicable to detecting insertion of the removable memory card 10. If the receptacle is configured to receive a microSD card, the process 28 is applicable to detecting insertion of the removable memory card 16. In this manner, the removable memory card 10 or 16 is inserted into the receptacle 26 (block 30). Upon insertion, the housing 12, 18 of the removable memory card 10, 16, respectively, causes a physical switch within the receptacle 26 to activate. A pin within the receptacle 26 that is dedicated to receiving card insertion information is operatively coupled to the physical switch. The physical switch is configured to couple the pin to ground when that physical switch is activated. To detect insertion of the removable memory card 10, 16, the process 28 detects whether the pin that is operatively coupled to the physical switch is coupled to ground (block 32). If the pin is coupled to ground, the process 28 detects that the removable memory card 10, 16 has been inserted into the receptacle 26. However, if the pin is not coupled to ground, the process 28 concludes that no removable memory card 10, 16 has been inserted into the receptacle 26. Thus, the process 28 relies on the receptacle 26 being configured to receive a particular type of removable memory card 10, 16 to detect card insertion. Notably, while the process 28 includes coupling the pin to ground, other processes for detecting insertion of the removable memory cards 10, 16 may achieve similar functionality by coupling the pin to a supply voltage rather than to ground.

Figure 5A:
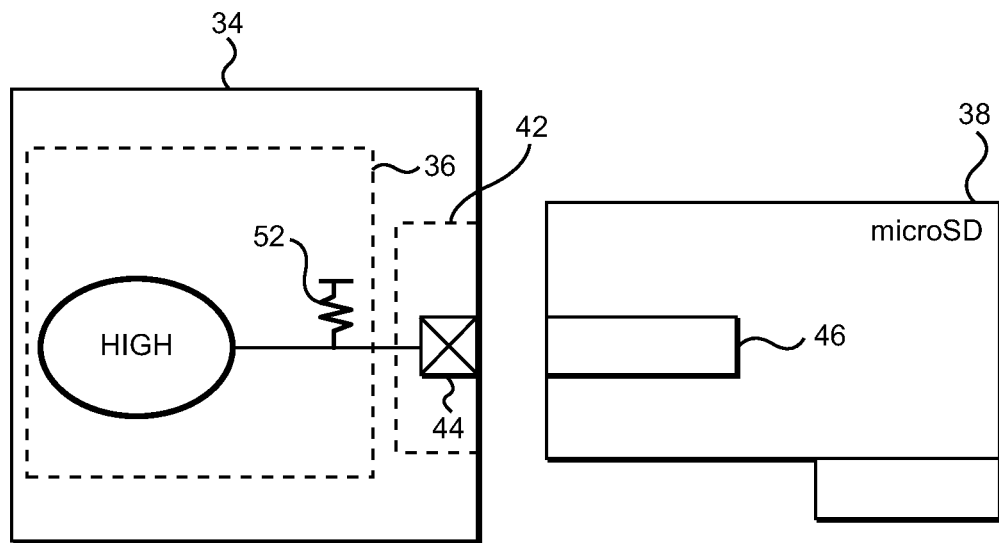
FIG. 5A is a block diagram of a removable memory card receptacle employing a control system configured to detect a type of a removable memory card inserted into the receptacle, wherein a microSD removable memory card is inserted into the receptacle.
Figure 5B:
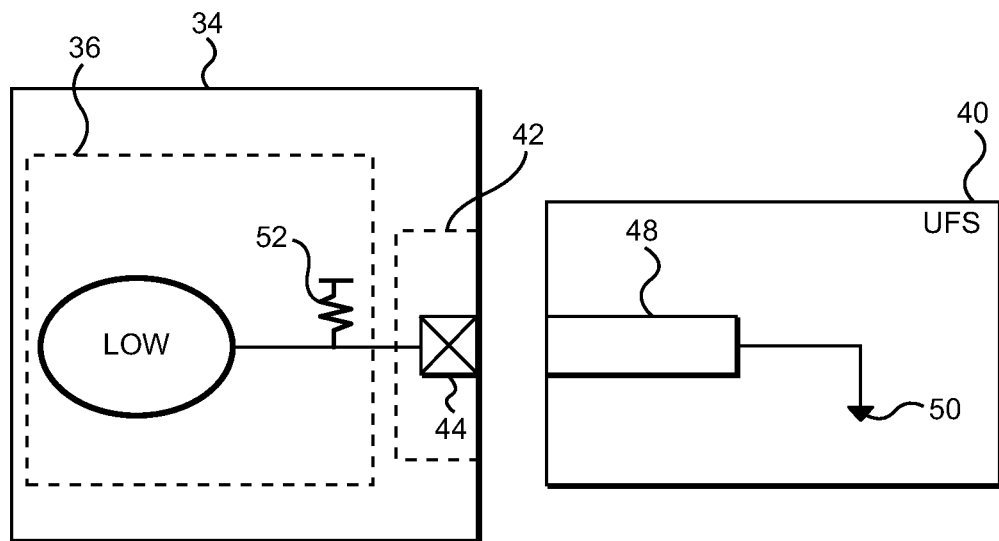
FIG. 5B is a block diagram of the removable memory card receptacle in FIG. 5A, wherein a Universal Flash Storage (UFS) removable memory card is inserted into the receptacle.

In this regard, FIGS. 5A and 5B illustrate a removable memory card receptacle 34 employing a control system 36 configured to detect a type of a removable memory card 40 inserted into the receptacle 34. FIG. 5A illustrates the removable memory card receptacle 34 operating with a microSD card 38 (which is identical to the removable memory card 16), while FIG. 5B illustrates the removable memory card receptacle 34 operating with a UFS card 40. In this example, the removable memory card receptacle 34 includes a housing 42 having a pin 44. The pin 44 is configured to operatively couple to a contact 46, 48 on the microSD card 38 and the UFS card 40, respectively. The control system 36 is configured to detect insertion of the microSD card 38 or the UFS card 40 into the removable memory card receptacle 34, such as by using the process 28 in FIG. 4. In addition to the control system 36 being configured to detect that a removable memory card has been inserted into the receptacle 34, the control system 36 is also configured to detect whether the contact 46, 48 is coupled to a pre-defined voltage. In this example, the control system 36 is configured to detect whether the contact 46, 48 is coupled to the pre-defined voltage, wherein the pre-defined voltage is ground 50. Notably, in other aspects, the control system 36 may achieve similar functionality by being configured to detect whether the contact 46, 48 is coupled to a supply voltage, such as Vcc, rather than ground 50. Further, the pre-defined voltage may be a voltage other than ground 50 or the supply voltage as needed or desired. With continuing reference to the example, if the control system 36 detects that the contact 46, 48 is not coupled to ground 50, the control system 36 is configured to communicate with the microSD card 38 using a microSD protocol. However, if the control system 36 detects that the contact 46, 48 is coupled to ground 50, the control system 36 is configured to communicate with the UFS card 40 using a UFS protocol. One way the control system 36 may be configured to detect whether the contact 46, 48 is coupled to ground 50 is by determining whether a current is present across a device within the control system 36, such as a pull-up resistor 52. For example, if a current is present across the pull-up resistor 52, the control system 36 may be configured to detect that the contact 48 is coupled to ground 50. However, if a current is not present across the pull-up resistor 52, the control system 36 may be configured to detect that the contact 46 is not coupled to ground 50.

With continuing reference to FIGS. 5A and 5B, to distinguish between memory card types, the removable memory card receptacle 34 takes advantage of the property that the microSD card 38 includes contacts that are not employed by the UFS card 40. In this manner, TABLE 3 below summarizes a hypothetical layout of contacts for the UFS card 40 in FIG. 5B. Note that because proposals to adopt UFS to a removable memory card are still emerging, the precise details of its implementation have not been standardized. Thus, TABLE 3 is used as an exemplary contact layout, but alternative contact layouts are also possible.

TABLE 3

UFS CONTACT LAYOUT

| | | UFS CONTACT PURPOSE | |
|---|---|---|---|
| Contact | Name | Type | Description |
| 1 | DAT2 | I/O/PP | Assignable/Reserved |
| 2 | CD/DAT3 | I/O/PP | Card detection/Connector data line 3 |
| 3 | CMD | PP | Command/Response line |
| 4 | Vdd | S | Power supply |
| 5 | CLK | I | Clock |
| 6 | Vss | S | Supply voltage |
| 7 | DAT0 | I/O/PP | Assignable |
| 8 | DAT1 | I/O/PP | Assignable |

As illustrated when comparing the microSD contact layout in TABLE 2 to the UFS contact layout in TABLE 3, certain contacts on the microSD card 38 are not required to correspond to similar contacts on the UFS card 40. For example, the DAT0, DAT1, and DAT2 contacts are configured for data input/output on the microSD card 38, while corresponding contacts are assignable on the UFS card 40. In this manner, the UFS card 40 may assign the DAT0 and DAT1 contacts for use as data input/output contacts, while reserving the DAT2 contact for an alternative use. Other contact/pin arrangements and/or uses are also within the scope of the present disclosure. In particular, while TABLE 1, TABLE 2, and TABLE 3 include the contact/pin arrangements for SD, microSD and UFS, respectively, according to an Ultra High Speed (UHS) bus I protocol, the present disclosure may also be applied to SD, microSD and UFS contact/pin arrangements employing a UHS bus II protocol.

In this regard, with continuing reference to FIGS. 5A and 5B, the contact 46 on the microSD card 38 is employed for the corresponding purpose in TABLE 2. For example, the contact 46 may correspond to the DAT2 contact, and thus, provide a connection to a connector data line 2. Similarly, the assignable contact 48 on the UFS card 40 corresponding to the DAT2 contact on the microSD card 38 is coupled to ground 50. Notably, the contact 48 is located on the UFS card 40 at a location corresponding to the location of the contact 46 on the microSD card 38. Because the locations of the contacts 46, 48 correspond on each respective card 38, 40, insertion of the microSD card 38 or the UFS card 40 results in the contacts 46, 48, respectively, coupling to the pin 44. Thus, upon card insertion, the control system 36 may distinguish between the microSD card 38 and the UFS card 40 by detecting whether the respective contact 46, 48 is coupled to ground 50.

Figure 5C:
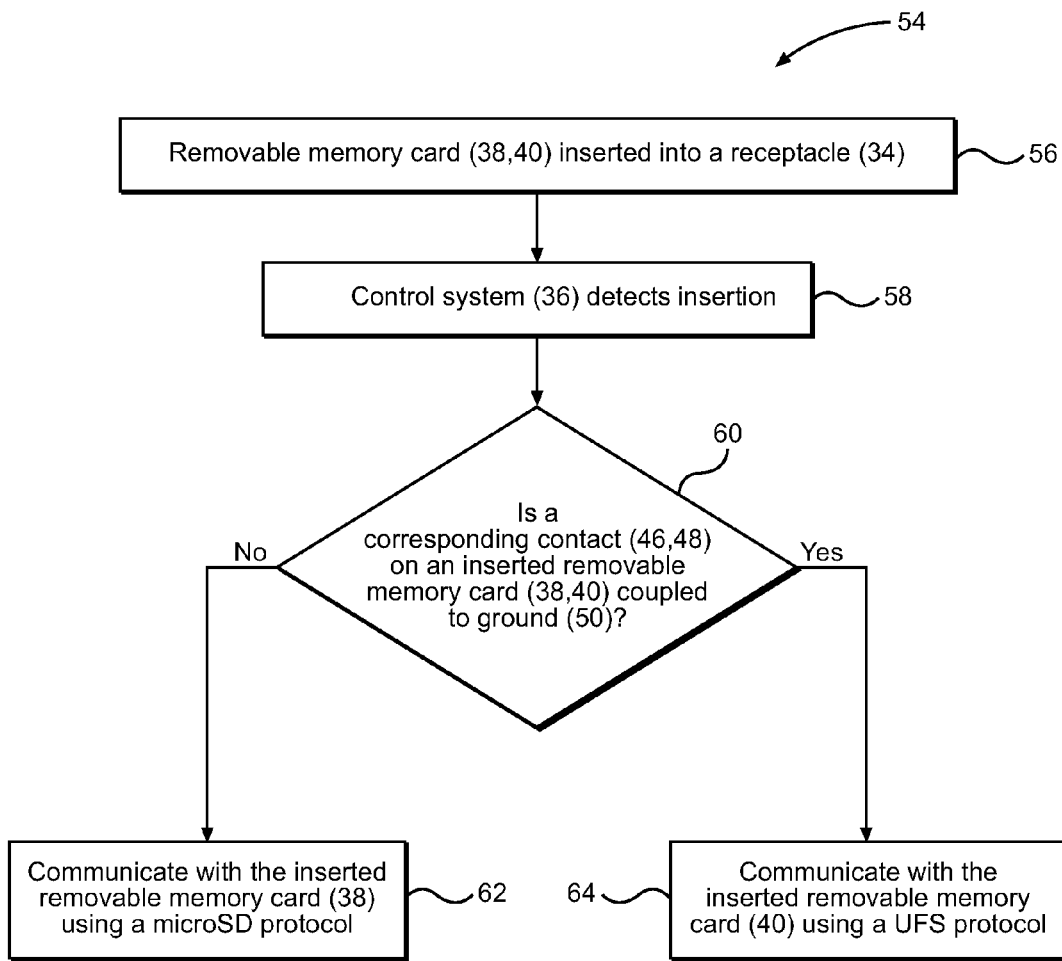
FIG. 5C is a flowchart illustrating an exemplary process for detecting a type of a removable memory card inserted into a removable memory card receptacle.

In this regard, FIG. 5C illustrates a process 54 employed by the removable memory card receptacle 34 in FIGS. 5A and 5B for detecting a type of a removable memory card inserted into the receptacle 34. In particular, a removable memory card, either the microSD card 38 or the UFS card 40, is inserted into the removable memory card receptacle 34 (block 56). The control system 36 detects such insertion (block 58). After detecting insertion of the removable memory card 38, 40, the control system 36 determines whether the corresponding contact 46, 48 on the removable memory card 38, 40, respectively, is coupled to ground 50 (block 60). If the contact 46, 48 is not coupled to ground 50, the control system 36 determines that the inserted card is the microSD card 38, and communicates with the microSD card 38 using a microSD protocol (block 62). However, if the contact 46, 48 is coupled to ground 50, the control system 36 determines that the inserted card is the UFS card 40, and communicates with the UFS card 40 using a UFS protocol (block 64). By detecting the type of removable memory card in this manner, the removable memory card receptacle 34 is able to distinguish between the microSD card 38 and the UFS card 40 without requiring an additional pin or incurring increased card initialization time.

Figure 6A:
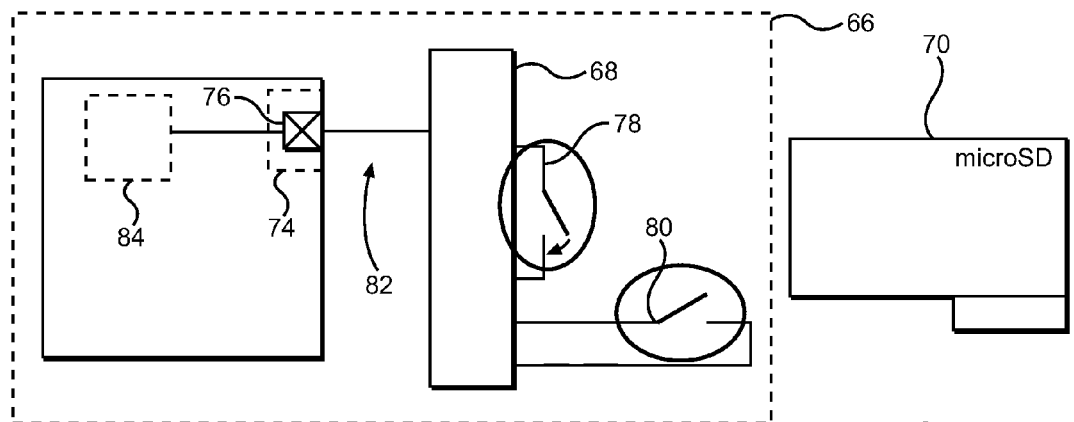
FIG. 6A is a block diagram of a removable memory card receptacle employing a control circuit configured to detect a type of a removable memory card inserted into the receptacle, wherein a microSD removable memory card is inserted into the receptacle.
Figure 6B:
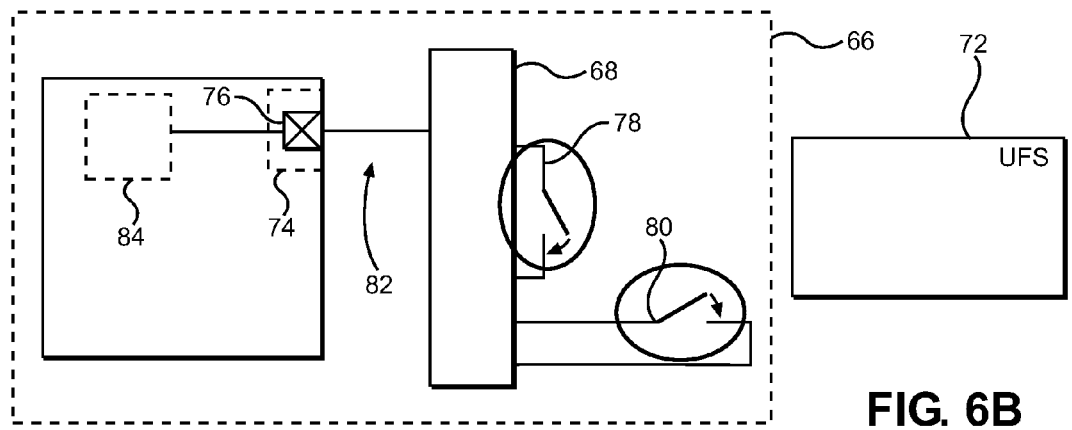
FIG. 6B is a block diagram of the removable memory card receptacle in FIG. 6A, wherein a UFS removable memory card is inserted into the receptacle.

In addition to detecting the type of an inserted removable memory card based upon electrical properties of the card, the type of a removable memory card may also be detected based upon its physical properties. In this regard, FIGS. 6A and 6B illustrate a removable memory card receptacle 66 employing a control circuit 68 that includes software configured to detect a type of a removable memory card inserted into the receptacle 66. Notably, while this aspect uses software in the control circuit 68 for card type detection, other aspects may achieve similar functionality by employing hardware rather than software, or a combination of software and hardware. FIG. 6A illustrates the removable memory card receptacle 66 operating with a microSD card 70 (which is identical to the removable memory card 16), while FIG. 6B illustrates the removable memory card receptacle 66 operating with a UFS card 72. In this example, the removable memory card receptacle 66 includes a housing 74 having a pin 76 that is used for both card insertion and card type detection. The removable memory card receptacle 66 also includes an insertion switch 78 and a type switch 80. The insertion switch 78 is coupled to the control circuit 68, and is configured to detect insertion of a removable memory card, such as the microSD card 70 and the UFS card 72. More specifically, upon insertion of a removable memory card, the insertion switch 78 is activated, causing the control circuit 68 to receive an insertion signal (not shown). The type switch 80 is also coupled to the control circuit 68, and is configured to discriminate between types of removable memory cards inserted into the receptacle 66 based on the form factor of the inserted card. In particular, upon insertion of a removable memory card, the type switch 80 may either activate or remain de-activated, depending on the form factor of the inserted card, causing the control circuit 68 to receive a type signal (not shown). The software on the control circuit 68 is configured to generate a detection signal 82 based on the insertion and type signals. The detection signal 82 is provided to the pin 76. Based on the information relayed in the detection signal 82, a control system 84 communicates with the microSD card 70 or the UFS card 72 using a microSD protocol or UFS protocol, respectively.

Figure 6C:
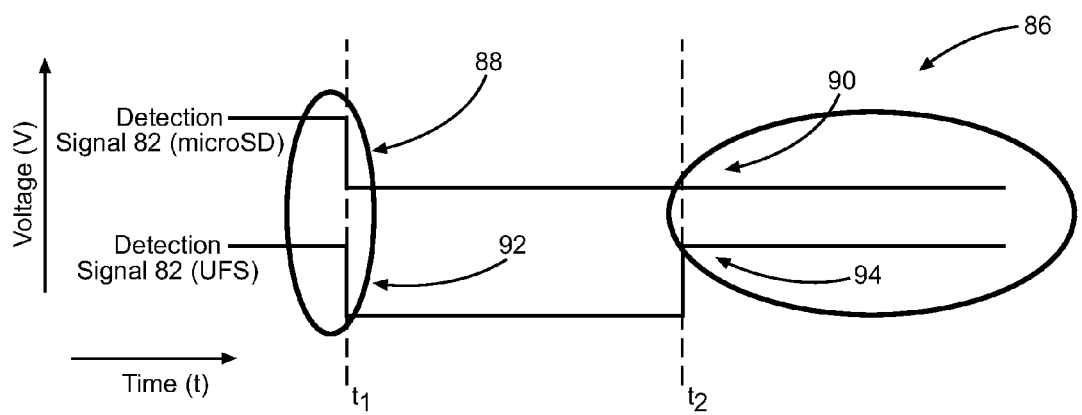
FIG. 6C is a signal diagram illustrating exemplary output signals of the control circuit in FIGS. 6A and 6B in response to both a microSD and a UFS removable memory card being inserted into the removable memory card receptacle, respectively.

To employ the pin 76 to detect both card insertion and card type, the software on the control circuit 68 is configured to provide the detection signal 82 to the pin 76 with specific timing. In particular, the software on the control circuit 68 is configured to provide the detection signal 82 to the pin 76 so as to indicate card insertion at a first point in time, while the detection signal 82 indicates the card type at a later, second point in time. In this regard, FIG. 6C illustrates a signal diagram 86 illustrating the detection signal 82 in response to both the microSD card 70 and the UFS card 72 being inserted into the removable memory card receptacle 66, respectively. The top line of the signal diagram 86 illustrates the detection signal 82 related to insertion of the microSD card 70 (labeled Detection Signal 82 (microSD)), while the bottom line illustrates the detection signal 82 related to insertion of the UFS card 72 (labeled Detection Signal 82 (UFS)). In this manner, the Detection Signal 82 (microSD) transitions to a low voltage at time $t_1$ (arrow 88) indicating card insertion. At time $t_2$, the Detection Signal 82 (microSD) continues at a low voltage (arrow 90), indicating that the microSD card 70 is inserted into the receptacle 66. Similarly, the Detection Signal 82 (UFS) transitions to a low voltage at time $t_1$ (arrow 92), indicating card insertion. However, at time $t_2$, the Detection Signal 82 (UFS) transitions to a high voltage (arrow 94), indicating that the UFS card 72 is inserted into the receptacle 66.

Figure 6D:
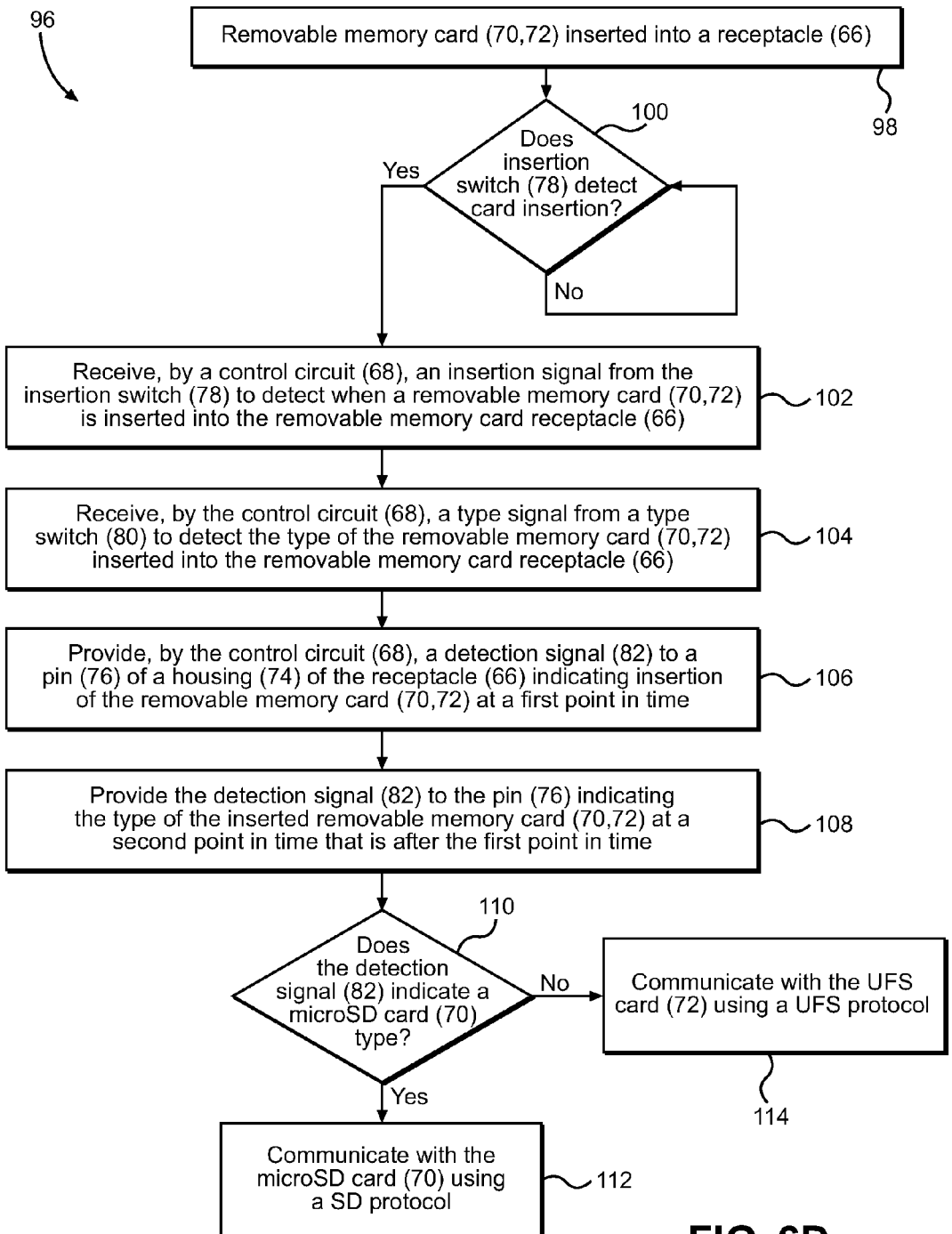
FIG. 6D is a flowchart illustrating an exemplary process for detecting a type of a removable memory card placed into a removable memory card receptacle.

In this regard, FIG. 6D illustrates a process 96 employed by the removable memory card receptacle 66 in FIGS. 6A and 6B for detecting a type of a removable memory card inserted into the receptacle 66. In particular, a removable memory card, either the microSD card 70 or the UFS card 72, is inserted into the removable memory card receptacle 66 (block 98). Upon card insertion, the insertion switch 78 determines whether a removable memory card was properly inserted into the receptacle 66 (block 100). More specifically, if the insertion switch 78 is not activated, it continues to wait for insertion of a removable memory card at block 98. If the insertion switch 78 is activated, and thus detects that a removable memory card is inserted into the receptacle 66, the control circuit 68 receives an insertion signal from the insertion switch 78 indicating card insertion (block 102). Further, the control circuit 68 receives the type signal from the type switch 80 when the removable memory card is inserted into the receptacle 66 (block 104).

With continuing reference to FIG. 6D, the control circuit 68 uses the insertion signal and the type signal to generate the detection signal 82. The control circuit 68 provides the detection signal 82 to the pin 76 at a first point in time, which indicates that the removable memory card is inserted into the receptacle 66 (block 106). In this example, if the detection signal 82 transitions to a low voltage, a software interrupt is generated in the control circuit 68. The software interrupt notifies the control circuit 68 to review the detection signal 82 after a defined amount of time to determine the type of removable memory card inserted into the receptacle 66. Thus, at a second point in time that occurs after the first point in time, the control circuit 68 provides the detection signal 82 to the pin 76 so as to indicate the type of the removable memory card inserted into the receptacle 66 (block 108). In this example, the control system 84 determines the type of the removable memory card inserted into the receptacle 66 by determining whether the detection signal 82 indicates a microSD card 70 type (block 110). If the detection signal 82 indicates that the microSD card 70 is inserted into the receptacle 66, the control system 84 communicates with the microSD card 70 using a microSD protocol (block 112). Conversely, if the detection signal 82 does not indicate that the microSD card 70 is inserted into the receptacle 66, the control system 84 concludes that the UFS card 72 is inserted into the receptacle 66, and the control system 84 communicates with the UFS card 72 using a UFS protocol (block 114). By detecting the type of removable memory card in this manner, the removable memory card receptacle 66 is able to distinguish between the microSD card 70 and the UFS card 72 without requiring an additional pin or incurring additional card initialization time, as the same pin 76 is employed for both insertion and card type detection.

Figure 7A:
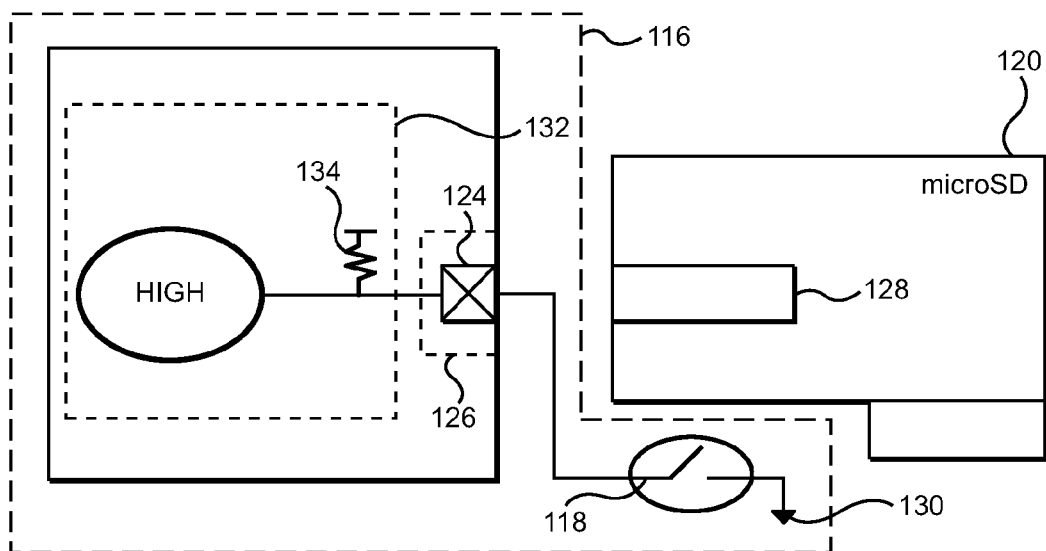
FIG. 7A is a block diagram of a removable memory card receptacle employing a control system configured to detect a type of a removable memory card inserted into the receptacle, wherein a microSD removable memory card is inserted into the receptacle.
Figure 7B:
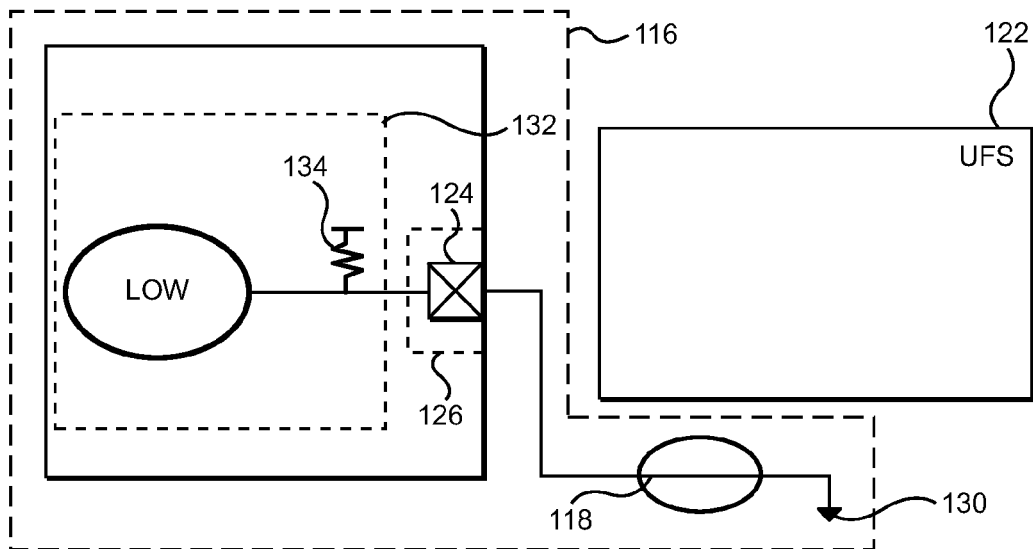
FIG. 7B is a block diagram of a removable memory card receptacle employing a control system configured to detect a type of a removable memory card inserted into the receptacle, wherein a UFS removable memory card is inserted into the receptacle.

In addition to the control circuit 68 and the type switch 80 described in FIGS. 6A and 6B, other aspects may achieve card type detection using the physical properties of a removable memory card in a different manner. In this regard, FIGS. 7A and 7B illustrate a removable memory card receptacle 116 employing a switch 118 used to detect a type of a removable memory card inserted into the receptacle 116. FIG. 7A illustrates the removable memory card receptacle 116 operating with a microSD card 120 (which is identical to the removable memory card 16), while FIG. 7B illustrates the removable memory card receptacle 116 operating with a UFS card 122. In this example, the switch 118 is coupled to a pin 124 within a housing 126. The pin 124 corresponds to a contact 128 employed on the microSD card 120. However, a corresponding contact is not employed on the UFS card 122. The switch 118 is configured to activate upon insertion of the UFS card 122 into the receptacle 116 due to the form factor of the UFS card 122, which couples the pin 124 to ground 130. Other aspects may achieve similar functionality by configuring the switch 118 to couple the pin 124 to a supply voltage, or other pre-defined voltage, rather than to ground 130 upon activation of the switch 118. Further, the switch 118 is configured to remain de-activated when the microSD card 120 is inserted into the receptacle 116 due to the form factor of the microSD card 120. This prevents the pin 124 from being coupled to ground 130. Thus, the switch 118 is configured to activate or remain de-activated based on the form factor of the removable memory card inserted into the receptacle 116. The pin 124 is coupled to a control system 132 that is configured to communicate with the microSD card 120 using a microSD protocol if the pin 124 provides a high voltage to the control system 132. Similarly, the control system 132 is configured to communicate with the UFS card 122 using a UFS protocol if the pin 124 provides a low voltage to the control system 132. Further, the control system 132 may employ a pull-up resistor 134 that functions similarly to the pull-up resistor 52 previously described in FIGS. 5A and 5B.

Figure 7C:
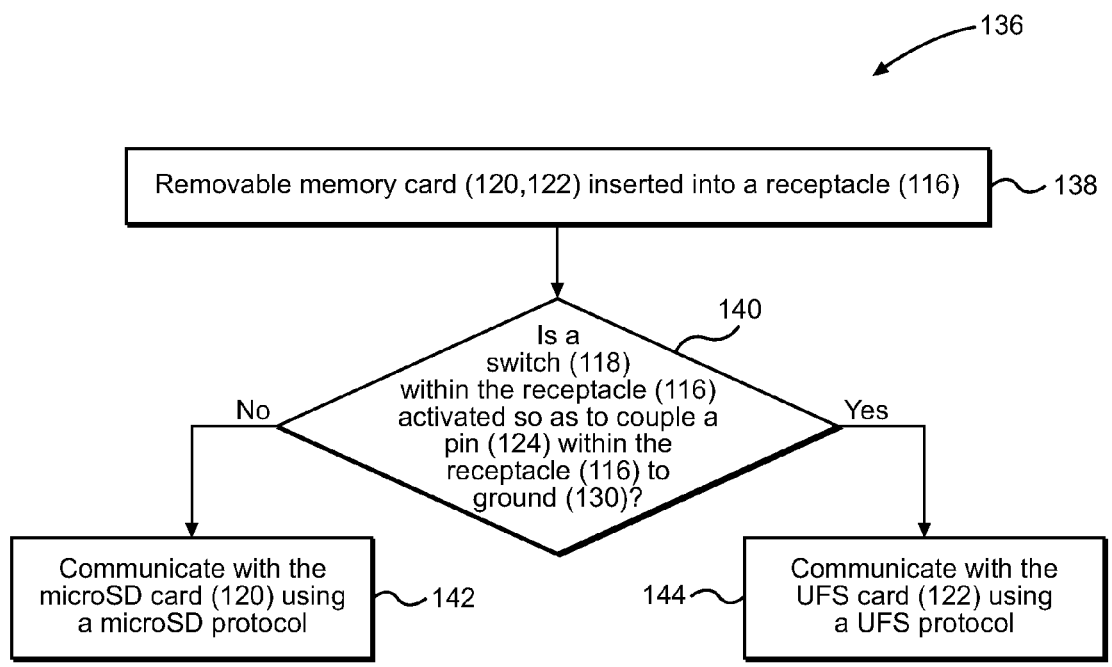
FIG. 7C is a flowchart illustrating an exemplary process for detecting a type of a removable memory card placed into a removable memory card receptacle.

In this regard, FIG. 7C illustrates a process 136 employed by the removable memory card receptacle 116 in FIGS. 7A and 7B for detecting a type of a removable memory card inserted into the receptacle 116. In particular, a removable memory card, either the microSD card 120 or the UFS card 122, is inserted into the removable memory card receptacle 116 (block 138). The switch 118 reacts to the form factor of the inserted removable memory card. More specifically, if the microSD card 120 is inserted into the receptacle 116, the switch 118 remains de-activated, thus preventing the pin 124 from coupling to ground 130. If the UFS card 122 is inserted into the receptacle 116, the switch 118 is activated, causing the pin 124 to couple to ground 130. Thus, to determine the type of card inserted into the receptacle 116, the control system 132 determines whether the pin 124 is coupled to ground 130 (block 140). If the control system 132 detects that the pin 124 is not coupled to ground 130, the control system 132 communicates with the microSD card 120 using a microSD protocol (block 142). If the control system 132 detects that the pin 124 is coupled to ground 130, the control system 132 communicates with the UFS card 122 using a UFS protocol (block 144). By employing the existing pin 124 corresponding to a contact on the microSD card 120, but not to a contact on the UFS card 122, for card type detection in this manner, the removable memory card receptacle 116 is able to distinguish between the microSD card 120 and the UFS card 122 without requiring an additional pin or incurring additional card initialization time.

While the present disclosure focuses on distinguishing between UFS and microSD removable memory cards, it should be noted that the aspects disclosed herein may also be configured to distinguish between UFS and other flavors of SD removable memory cards. Such other flavors of SD removable memory cards include, but are not limited to, cards of type SD, miniSD, SDHC, miniSDHC, microSDHC, and SDXC.

The removable memory card type detection systems and methods according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 8:
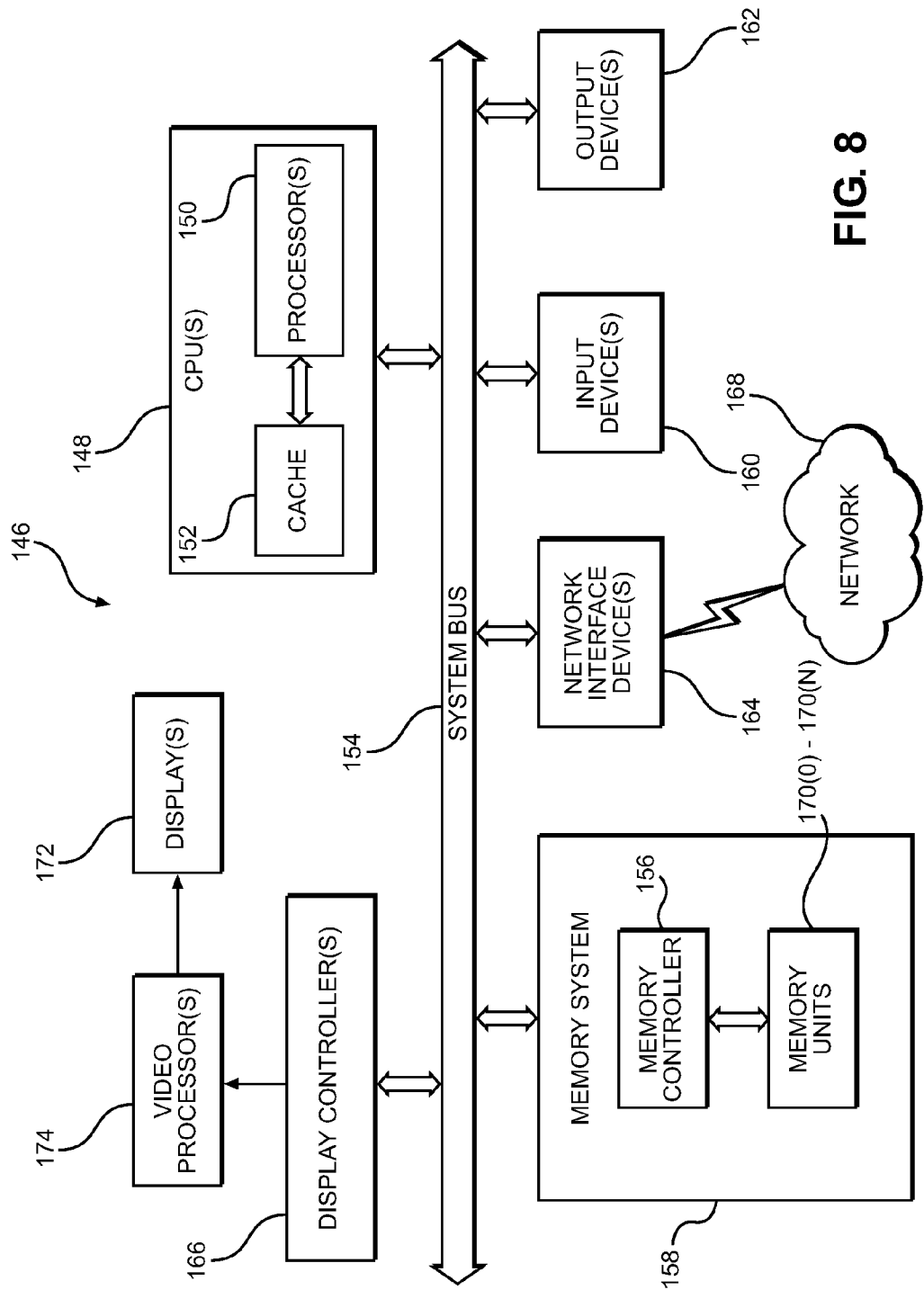
FIG. 8 is a block diagram of an exemplary processor-based system that can include the removable memory card receptacles of FIG. 5A, 5B or 6A, 6B.

In this regard, FIG. 8 illustrates an example of a processor-based system 146 that can employ the removable memory card receptacle 34 illustrated in FIGS. 5A, 5B; the removable memory card receptacle 66 illustrated in FIG. 6A, 6B; or the removable memory card receptacle 116 illustrated in FIGS. 7A, 7B. In this example, the processor-based system 146 includes one or more central processing units (CPUs) 148, each including one or more processors 150. The CPU(s) 148 may have cache memory 152 coupled to the processor(s) 150 for rapid access to temporarily stored data. The CPU(s) 148 is coupled to a system bus 154 and can intercouple devices included in the processor-based system 146. As is well known, the CPU(s) 148 communicates with these other devices by exchanging address, control, and data information over the system bus 154. For example, the CPU(s) 148 can communicate bus transaction requests to a memory controller 156.

Other devices can be connected to the system bus 154. As illustrated in FIG. 8, these devices can include a memory system 158, one or more input devices 160, one or more output devices 162, one or more network interface devices 164, and one or more display controllers 166, as examples. The input device(s) 160 can include any type of input device, including but not limited to input keys, switches, voice processors, etc. The output device(s) 162 can include any type of output device, including but not limited to audio, video, other visual indicators, etc. The network interface device(s) 164 can be any devices configured to allow exchange of data to and from a network 168. The network 168 can be any type of network, including but not limited to a wired or wireless network, a private or public network, a local area network (LAN), a wide local area network (WLAN), and the Internet. The network interface device(s) 164 can be configured to support any type of communications protocol desired. The memory system 158 can include one or more memory units 170(0)-170(N).

The CPU(s) 148 may also be configured to access the display controller(s) 166 over the system bus 154 to control information sent to one or more displays 172. The display controller(s) 166 sends information to the display(s) 172 to be displayed via one or more video processors 174, which process the information to be displayed into a format suitable for the display(s) 172. The display(s) 172 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A removable memory card receptacle for receiving removable memory cards, comprising:
   a housing comprising a pin configured to operatively couple with a corresponding contact on an inserted removable memory card; and
   a control system operatively coupled to the pin of the housing, the control system configured to:
   detect whether the corresponding contact is coupled to a pre-defined voltage;
   communicate with the inserted removable memory card using a Secure Digital (SD) protocol if the corresponding contact is not coupled to the pre-defined voltage; and
   communicate with the inserted removable memory card using a Universal Flash Storage (UFS) protocol if the corresponding contact is coupled to the pre-defined voltage.

2. The removable memory card receptacle of claim 1, wherein the control system is configured to communicate with the inserted removable memory card using a micro Secure Digital (microSD) protocol if the corresponding contact is not coupled to the pre-defined voltage.

3. The removable memory card receptacle of claim 1, wherein the control system is further configured to detect insertion of a removable memory card into the removable memory card receptacle.

4. The removable memory card receptacle of claim 1, wherein the pre-defined voltage is selected from the group consisting of ground and a supply voltage.

5. The removable memory card receptacle of claim 4, wherein the control system further comprises a pull-up resistor.

6. The removable memory card receptacle of claim 5, wherein the control system is configured to detect whether the corresponding contact is coupled to the pre-defined voltage by being configured to detect whether a current is present across the pull-up resistor.

7. The removable memory card receptacle of claim 6, wherein the control system is configured to detect that the corresponding contact is coupled to ground if the current is present across the pull-up resistor.

8. The removable memory card receptacle of claim 6, wherein the control system is configured to detect that the corresponding contact is not coupled to ground if the current is not present across the pull-up resistor.

9. The removable memory card receptacle of claim 1, wherein the pin is configured to operatively couple with a DAT2 contact on the inserted removable memory card.

10. A method for detecting a type of a removable memory card inserted into a receptacle for receiving removable memory cards, comprising:
   detecting whether a corresponding contact on an inserted removable memory card is coupled to a pre-defined voltage;
   communicating with the inserted removable memory card using a Secure Digital (SD) protocol if the corresponding contact is not coupled to the pre-defined voltage; and
   communicating with the inserted removable memory card using a Universal Flash Storage (UFS) protocol if the corresponding contact is coupled to the pre-defined voltage.

11. The method of claim 10, further comprising communicating with the inserted removable memory card using a micro Secure Digital (microSD) protocol if the corresponding contact is not coupled to the pre-defined voltage.

12. The method of claim 10, further comprising detecting insertion of a removable memory card into a receptacle for receiving removable memory cards.

13. The method of claim 10, wherein the pre-defined voltage is selected from the group consisting of ground and a supply voltage.

14. The method of claim 13, wherein detecting whether the corresponding contact on the inserted removable memory card is coupled to the pre-defined voltage comprises detecting whether a current is present across a pull-up resistor.

15. The method of claim 14, wherein detecting that the corresponding contact is coupled to ground comprises detecting that the current is present across the pull-up resistor.

16. The method of claim 14, wherein detecting that the corresponding contact is not coupled to ground comprises detecting that the current is not present across the pull-up resistor.

17. A removable memory card receptacle for receiving removable memory cards, comprising:
   a housing comprising a pin coupled to a control circuit;
   a type switch coupled to the control circuit, the type switch configured to discriminate between types of removable memory cards based on differing form factors; and
   the control circuit comprising software configured to receive a type signal from the type switch to detect a type of removable memory card inserted into a removable memory card receptacle, wherein the type includes Secure Digital (SD) or Universal Flash Storage (UFS).

18. The removable memory card receptacle of claim 17, further comprising:
   an insertion switch coupled to the control circuit, the insertion switch configured to detect insertion of the removable memory card; and
   the control circuit comprising the software further configured to receive an insertion signal from the insertion switch to detect when the removable memory card is inserted into the removable memory card receptacle.

19. The removable memory card receptacle of claim 18, wherein the control circuit comprises the software that is further configured to provide a detection signal to the pin.

20. The removable memory card receptacle of claim 19, wherein the control circuit comprises the software that is further configured to:
   provide the detection signal to the pin indicating insertion of the removable memory card at a first point in time; and
   provide the detection signal to the pin indicating the type of the inserted removable memory card at a second point in time that is after the first point in time.

21. The removable memory card receptacle of claim 19, further comprising:
   a control system operatively coupled to the pin, the control system configured to:
      communicate with the inserted removable memory card using an SD protocol if the detection signal indicates the type of the inserted removable memory card is SD; and
      communicate with the inserted removable memory card using a UFS protocol if the detection signal indicates the type of the inserted removable memory card is UFS.

22. The removable memory card receptacle of claim 21, wherein the control system is further configured to communicate with the inserted removable memory card using a micro Secure Digital (microSD) protocol if the detection signal indicates the type of the inserted removable memory card is microSD.

23. A method for detecting a type of a removable memory card placed into a receptacle for receiving removable memory cards, comprising:
   discriminating between types of removable memory cards based on differing form factors using a type switch; and
   receiving, by a control circuit, a type signal from the type switch to detect the type of the removable memory card inserted into a removable memory card receptacle, wherein the type includes Secure Digital (SD) or Universal Flash Storage (UFS).

24. The method of claim 23, further comprising:
   detecting insertion of the removable memory card using an insertion switch; and
   receiving, by the control circuit, an insertion signal from the insertion switch to detect when the removable memory card is inserted into the removable memory card receptacle.

25. The method of claim 24, further comprising providing, by the control circuit, a detection signal to a pin of a housing of the removable memory card receptacle.

26. The method of claim 25, further comprising:
   providing the detection signal to the pin indicating the insertion of the removable memory card at a first point in time; and
   providing the detection signal to the pin indicating the type of the inserted removable memory card at a second point in time that is after the first point in time.

27. The method of claim 25, further comprising:
   communicating with the inserted removable memory card using an SD protocol if the detection signal indicates the type of the inserted removable memory card is SD; and communicating with the inserted removable memory card using a UFS protocol if the detection signal indicates the type of the inserted removable memory card is UFS.

28. The method of claim 27, further comprising communicating with the inserted removable memory card using a micro Secure Digital (microSD) protocol if the detection signal indicates the type of the inserted removable memory card is microSD.

\* \* \* \* \*